United States Patent [19]

Chevallier et al.

[11] Patent Number: 5,132,281
[45] Date of Patent: Jul. 21, 1992

[54] PROCESS OF MAKING FLUORINE-STABILIZED SUPERCONDUCTOR MATERIALS

[75] Inventors: Bernard Chevallier, Talence; Jean-Michel Dance; Jean Etourneau, both of Pessac; Lucien Lozano, Carbon Blanc; Alain Tressaud, Pessac; Robert Tournier, Bilieu; Andre Sulpice, Grenoble; Jacques Chaussy, Echirolles; Pascal Lejay, Pont de Claix, all of France

[73] Assignee: Rhone-Poulenc Chimie, Courbevoie, France

[21] Appl. No.: 631,492

[22] Filed: Dec. 21, 1990

Related U.S. Application Data

[62] Division of Ser. No. 332,177, Apr. 3, 1989, Pat. No. 5,002,927.

[30] Foreign Application Priority Data

Apr. 1, 1988 [FR] France .................. 88 04366

[51] Int. Cl.$^5$ .......................... C23C 16/00
[52] U.S. Cl. .......................... 505/1; 252/521; 420/901; 428/930; 505/725; 505/775
[58] Field of Search .......... 505/1, 725, 775; 428/930; 420/901; 252/521

[56] References Cited

U.S. PATENT DOCUMENTS 4,916,116  4/1990  Yamazaki .................. 505/1

FOREIGN PATENT DOCUMENTS 0287325  10/1988  European Pat. Off.

OTHER PUBLICATIONS

Bansal et al, "Effect of fluoride doping on the transition temperature of $YBa_2Cu_3O_{6.5+\delta}$", Appl. Phys. Lett., vol. 52, No. 10, Mar. 7, 1988), pp. 838–840.

Bhargava et al, "Effects of Atmosphere on $Ba_2YCu_3O_x$ During Processing", Materials Letters, vol. 5, Nos. 11–12 (Oct. 1987), pp. 495–498.

Kohno et al, "Characteristics of High-$T_c$ Oxide Wire", Physica (1987), pp. 429–431.

Perrin et al, "Actual fluorination of Y—Ba—Cu—O high-$T_c$ superconductors by a solid-gas reaction under $NF_3$ flow", supercond. Sci. Technol., vol. 2 (1989), pp. 35–42.

Tesmer et al, "Effects And Behavior Of Implanted Fluorine In High Temperature Superconductors", Mat. Res. Soc. Symp. Proc., vol. 99 (1988), pp. 643–646.

Davies et al, "Fluorination of Superconducting $Ba_2YCu_3O_{9-\delta}$", Solid State Communications, vol. 64, No. 12 (1987), pp. 1441–1444.

Ovshinsky et al, "Superconductivity at 155 K", Physical Review Letters, vol. 58, No. 24 (Jun. 15, 1987), pp. 2579–2581.

Young et al, "Superconductivity in the Fluorinated YBaCuO", Mat. Res. Soc. Soc. Symp. Proc., vol. 99 (1988), pp. 549–552.

Primary Examiner—Upendra Roy
Attorney, Agent, or Firm—Burns, Doane, Swecker & Mathis

[57] ABSTRACT

Ceramic superconductor materials, e.g., of rare earth/alkaline earth metal/transition metal/oxygen type, contain an effective stabilizing amount of fluorine atoms distributed therein in a concentration gradient decreasing from the external face surface of the material to the core region thereof; advantageously the fluorine atoms are principally distributed in an external protective diffusion barrier layer.

9 Claims, 10 Drawing Sheets

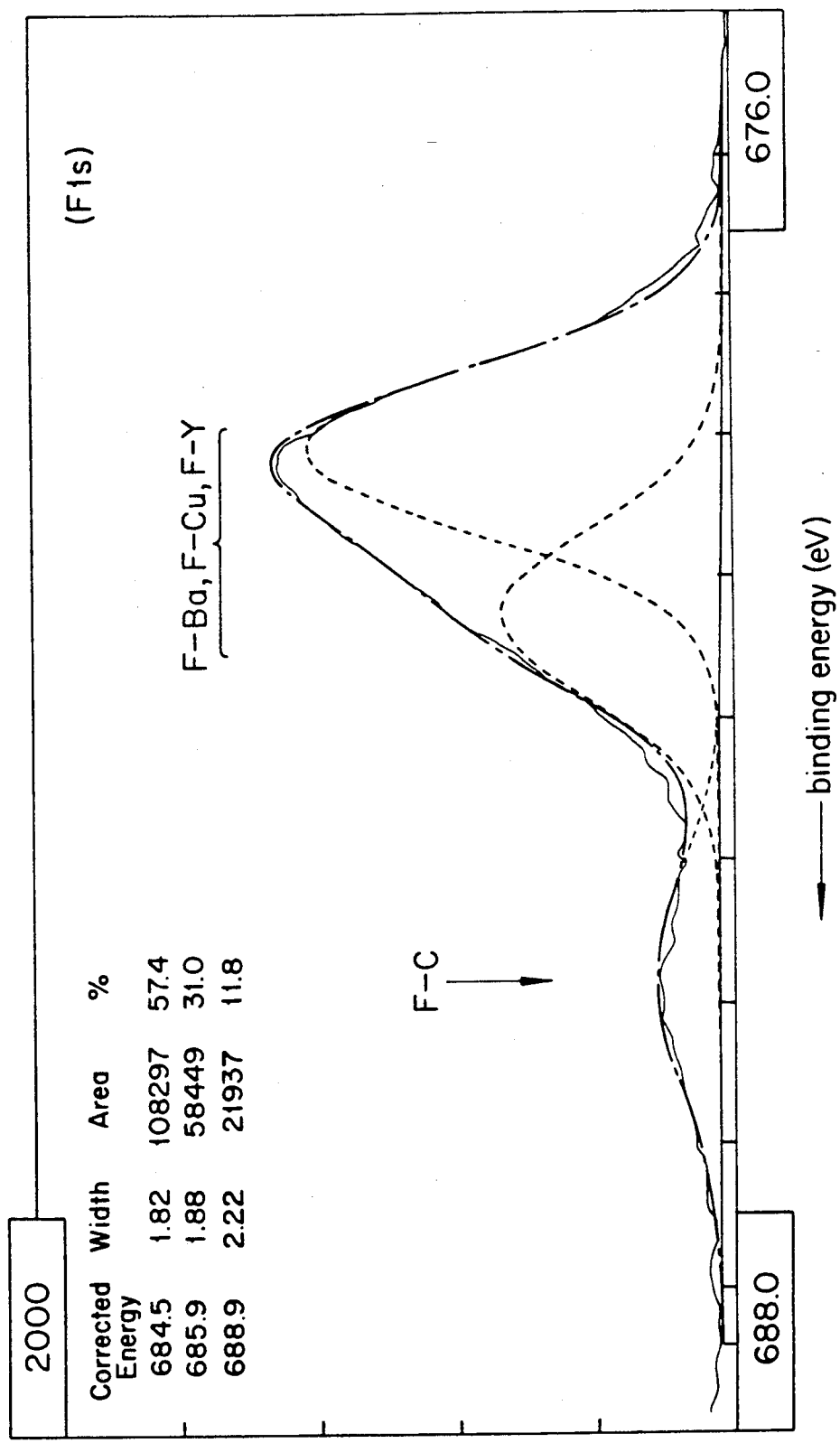

PROCESS OF MAKING FLUORINE-STABILIZED SUPERCONDUCTOR MATERIALS

This application is a division of application Ser. No. 07/332,177, filed Apr. 3, 1989, now U.S. Pat. No. 5,002,927.

BACKGROUND OF THE INVENTION

1. Field of the Invention

The present invention relates to novel materials that are superconducting at high temperatures, hereinafter designated as "HT superconductors", and to the production of such novel HT superconductors having stabilized, and even enhanced superconducting properties, by low temperature fluorination.

2. Description of the Prior Art

It is known to this art that, in theory, when superconductors are cooled to very low temperatures, they offer no resistance to the flow of an electric current, and, when subjected to an external magnetic field, diamagnetic properties result.

Until recently, the state of superconductivity was observed only in certain materials below a threshold temperature, designated the "critical temperature", such threshold typically approximating absolute zero. This type of limitation obviously presents a serious drawback in the large scale development of any potential applications resulting from superconductivity.

Very recently, however, research has given rise to the development of new materials having superconducting properties at higher temperatures.

More specifically, the recent discovery of oxygen containing materials based on copper, rare earths (lanthanum, yttrium, erbium, etc.) or bismuth or thallium, and alkaline earth metals (barium, strontium, calcium, etc.) having high critical temperatures (Tc) paved an unexpected research path in the field of HT superconductivity.

In the year 1987, for example, a veritable avalanche of results relative to the synthesis and the chemical and physical properties of a great number of novel superconducting materials was published.

Among the most frequently studied systems, Y-Ba-Cu-O is particularly representative, in which the phases derived from $YBa_2Cu_3O_7$ have critical temperatures on the order of 92° K.

Certain publications have even featured superconductors that were operational at temperatures close to or even higher than ambient temperature. In the latter case, however, no satisfactory test results were described.

Such materials present possibilities in widely varying fields, such as high-speed microelectronics, due to the elimination of the resistivity of connections, the manufacture of superconducting storage coils, in the use of superconductors having high critical temperatures for transportation purposes which entail electromagnetic levitation, and, as a general rule, in all applications which at the present time require the use of superconducting magnets.

But the improvement in the performance of HT superconducting materials and, in particular, increasing their critical temperature, mandates the stabilization of phases possessing an amount of perfectly defined anionic vacancies, or, in other words, perfect stability relative to the ambient temperature.

It too is well known to this art, on the other hand, that surface defects interfere with the intrinsic properties of such materials.

SUMMARY OF THE INVENTION

Accordingly, a major object of the present invention is the provision of novel superconducting materials which conspicuously avoid, or at least ameliorate, those "surface defect" disadvantages and drawbacks to date characterizing the state of this art, which novel superconducting materials comprise an insulating surface layer for the stabilization of their native superconductor properties, and which insulating surface layer effectively prevents any interreaction between the superconducting material and the ambient atmosphere.

Briefly, it has now unexpectedly been determined that high temperature superconducting materials having stabilized properties can be produced by subjecting such materials to a fluorination treatment at a temperature less than or equal to 120° C.

BRIEF DESCRIPTION OF THE DRAWINGS

FIG. 15 is an XPS spectrum indicating peak fluorine treatment of the superconductor crystal per FIG. 14.

DETAILED DESCRIPTION OF THE PREFERRED EMBODIMENTS OF THE INVENTION

Figure 1:
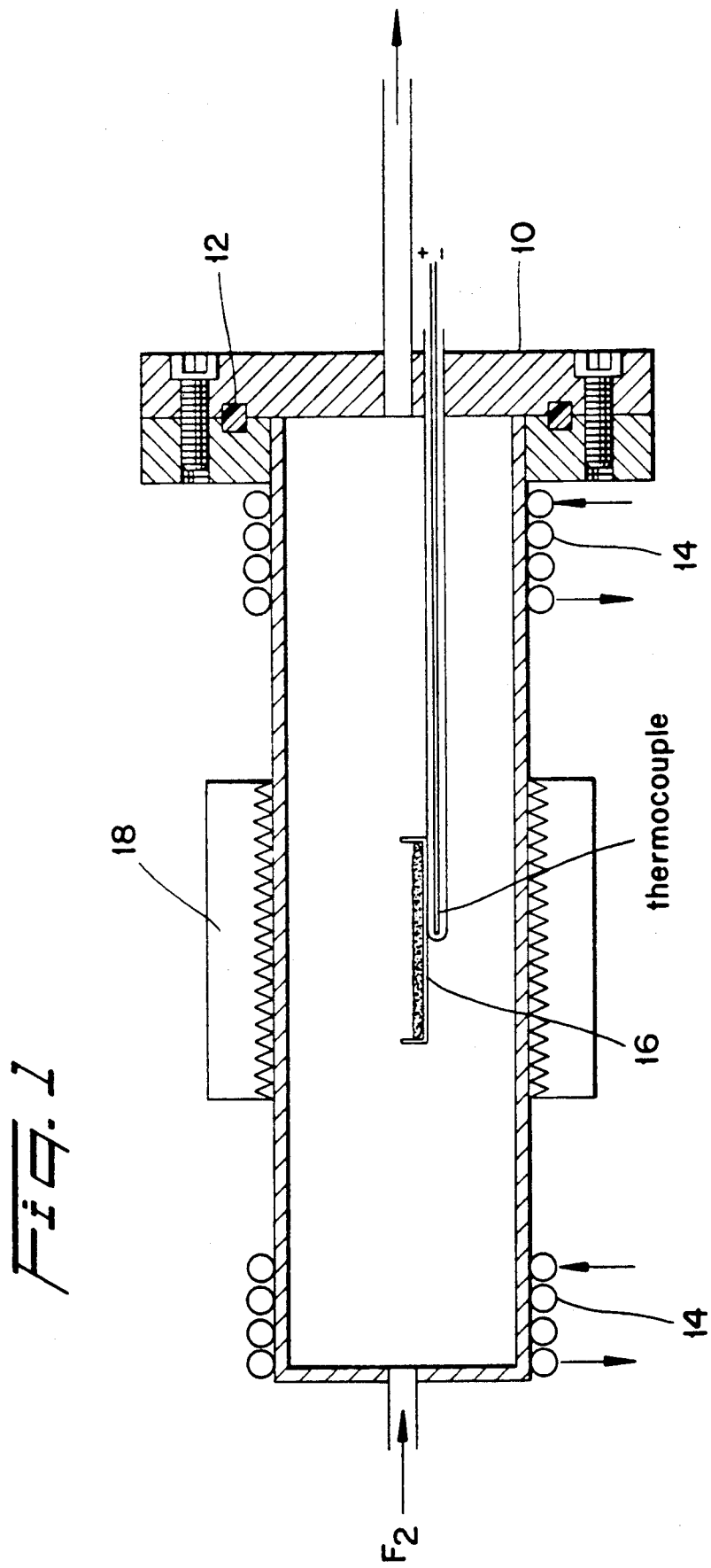
FIGS. 1 and 2 are cross-sectional views of suitable apparatus for carrying out the fluorination treatment according to the invention.

More particularly according to the present invention, it is critical that the fluorination treatment, more fully described hereinbelow, be strictly limited to the external face surfaces of the HT superconductors, without appreciably modifying their core properties. The lack of stability of the properties of HT superconducting materials, due largely to the instability of oxygen, is then effectively neutralized by the creation of an actual diffusion barrier (hereinafter referred to as the insulting layer) on the surface of such materials, thereby preventing any interchange with the external environment, particularly with the oxygen, water vapor or carbon dioxide contained in the ambient air and generally considered responsible, among other causes, for the degradation of superconducting properties.

It will be appreciated that the following description is not intended to be limited to the treatment and modification of any particular superconducting composition. To the contrary, it should be considered as being general in nature, i.e., applicable to the treatment and modification of any HT superconducting composition, whenever the stabilization and improvement of the properties of the latter is desired.

Exemplary HT superconducting properties suitable for treatment according to the present invention, particularly representative are those based on the rare earths (by "rare earths" are intended any element of the Periodic Table having atomic numbers ranging from 57 to 71, inclusive, and yttrium, which by convention is considered a rare earth), alkaline earth metals, transition metals and oxygen (oxide type superconducting ceramics).

The preferred rare earths are yttrium, lanthanum and erbium.

The alkaline earth metals are advantageously selected from among barium, strontium and calcium.

Finally, copper is the preferred transition metal, although any other transition metal may also be suitable.

The process according to the invention is especially applicable for the treatment of superconducting materials of the Y-Ba-Cu-O type. These systems were reviewed, in particular, in the *Journal of the American Chemical Society*, 109, 2528-2530 (1987). The specific formulation, $YBa_2Cu_3O_{7-x}$ ($0 \leq X \leq 0.5$), is a particularly notable example of HT superconducting materials that are advantageously treated according to the invention.

More generally, and without implying any limitation, the superconducting materials to be subjected to the treatment according to the invention may be in the form of a powder or of dense, sintered shaped articles.

These materials may be produced by any means known to this art.

Thus, if powders are used, they may be obtained by solid-state reaction, i.e., by a technique consisting essentially of reacting, in a solid phase and at a high temperature, a mixture of powders of oxides and/or salts containing a volatile anion (for example, the carbonate) of the different elements to constitute the desired superconducting composition.

These powders may also be prepared by the pyrolysis of precursor compositions previously obtained by various reactions taking place in the liquid phase (for example, by the coprecipitation of inorganic and/or organic species in an aqueous phase).

If dense shaped articles are used, these may be produced by the conventional method of sintering the aforementioned powders.

According to the invention, these materials are then subjected to the above fluorination treatment.

The agent of fluorination is preferably gaseous, but the use of a solid or a liquid fluorination agent is also within the scope of the invention.

Exemplary fluorination agents suitable for use in the treatment according to the invention, particularly representative are fluorine ($F_2$), hydrofluoric acid (HF), tetrafluoromethane, halogen fluorides, rare gas fluorides, nitrogen fluoride ($NF_3$) and boron fluoride ($BF_3$).

Fluorine gas is preferably used.

The fluorination agent may be used in pure state or diluted in a neutral gas, for example in nitrogen.

The pressure (or the partial pressure) of the fluorinating gas is not critical; it may range from several millibars to several bars, but, for practical reasons, pressures on the order of one bar are typically used.

Figure 2:
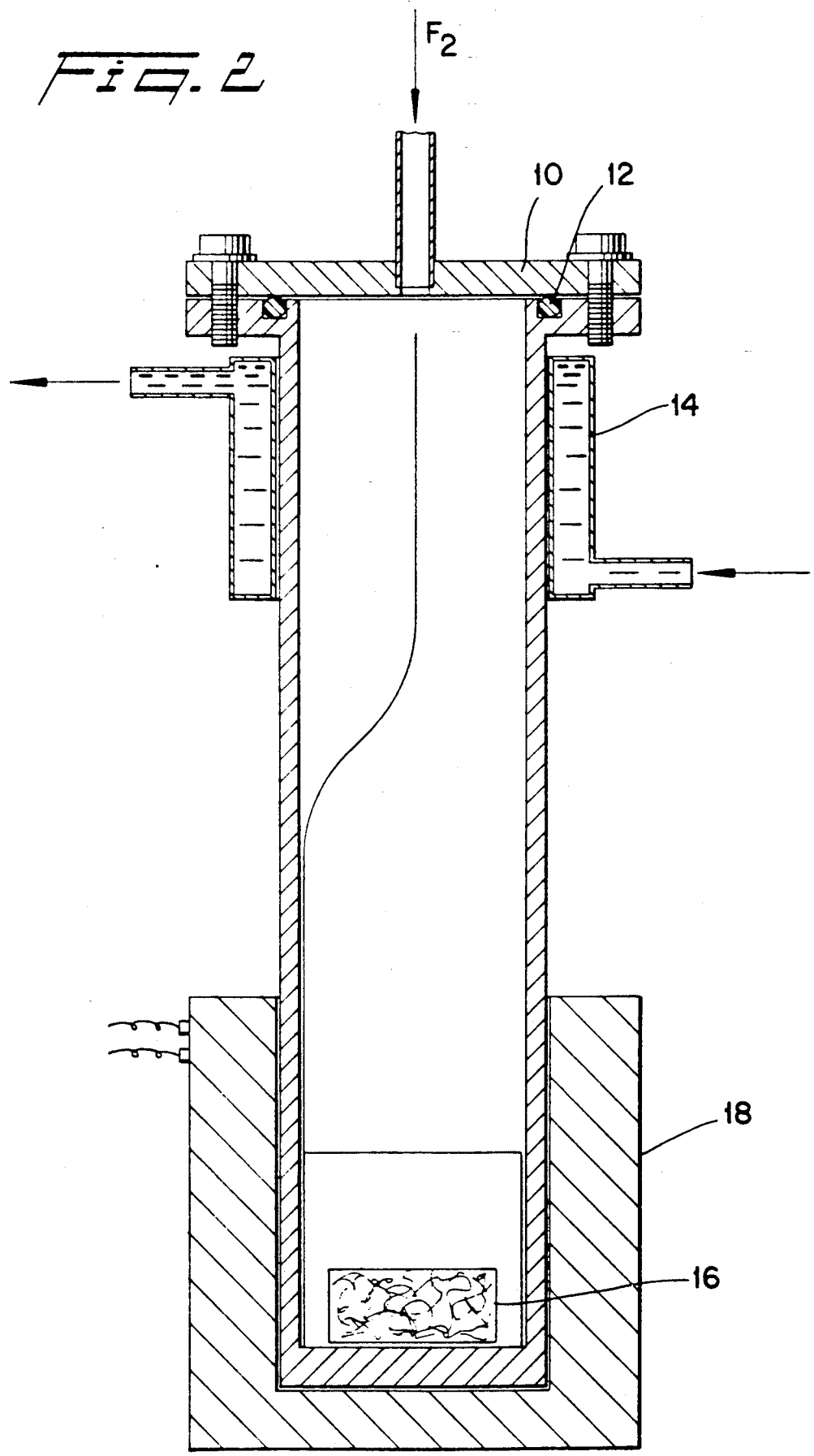

FIGS. 1 and 2 illustrate two types of apparatuses suitable for carrying out the treatment according to the invention.

These show a nickel reactor equipped at one end with a removable side plate 10, also made of nickel. Tightness is insured by means of a toric seal 12 of a fluorine polymer (Teflon, for example). This apparatus makes it possible to employ the fluorinating gas either under a static atmosphere or under a gaseous flowstream.

The gas is supplied by conventional means, while observing the precautions of use (see *Inorganic Solid Fluorides*, Academic Press (1985).

The inlet pressures range from a few mbar to 10 bar. The fluorinating gas, as indicated above, may be used either pure or diluted in a neutral gas. External cooling coils 14 permit the condensation and optional recovery of volatile fluorides and oxyfluorides. The center part of the reactor into which the HT superconductor specimens to be treated are placed, is equipped with a conventional resistance furnace 18 provided with a control system, thus making it possible to attain reaction temperatures ranging from ambient to 600° C.

In an essential embodiment of the process according to the invention, the fluorinating treatment is carried out at a temperature not exceeding 120° C. Even more preferably, the treatment is carried out at ambient temperature, i.e., at about 20° C.

The duration of the treatment may range from one to several hours, preferably on the order of ten hours.

This temperature limitation is extremely important in that it ensures that the core structure of the material will not be modified. As indicated above, the treatment according to the invention should not have any other appreciable effect, other than modifying the surface characteristics of the superconducting material, by creating a fine insulating layer intended to "encapsulate" the material.

This invention also features such treated superconducting materials, per se.

These materials are characterized in that they contain fluorine atoms distributed on a concentration gradient decreasing from their exposed face surfaces to the core of such materials.

The materials according to the invention have, in addition, at least one of the following characteristics:

(a) The fluorine atoms are distributed for the most part in the external layer of such materials. By "external layer" is intended a thickness of material, measured from the surface of the material, on the order of a few hundred Angstroms. And by the expression "for the most part" is intended that more than 50% of the fluorine atoms present in the material are located in said external layer;

(b) Said external layer is amorphous in structure;

(c) The percentage by weight of the total fluorine atoms present in the material does not exceed 2% and preferably does not exceed 1%; and (d) The fluorine atoms are present in the material in the form of fluorine or oxyfluorine compounds.

The superconducting materials characterized above display the following desirable properties:

(i) On the one hand, they are perfectly resistant to the ambient air, i.e., their superconducting properties do not degrade or deteriorate over time. (ii) On the other hand, when subjected to an appropriate post-heat treatment, their magnetic properties (Meissner effect) are improved. Also, (iii) they have a critical temperature, Tc, higher than those of the corresponding untreated superconductors. (The improvement in the above properties is demonstrated in the examples which follow).

Of course, modifications of the experimental parameters in the following examples, such as pressure, dilution and the nature of the fluorinating gas, duration and nature (dynamic or static) of the fluorination; and the like, all of which permit optimization of the insulation of HT superconductors, may be made in the process of the invention without departing from the spirit and scope thereof.

Furthermore, as above indicated, the subject process is applicable for the protective treatment of all superconducting materials, regardless of their form, whether powders, dense sintered shaped articles, thin layers, wires, crystals and matrix layers, etc.

The latter form includes, in particular, the preparation of "Josephson" junctions, the fluorinated layer being the insulating element of the juncture. The process of the invention is also applicable for the preparation of products including a substrate supporting a superconducting layer, itself comprising an insulating layer, as well as products comprising an alternating succession of superconducting layers and insulating layers. Each such product finds important applications in the field of electronics and microelectronics.

In order to further illustrate the present invention and the advantages thereof, the following specific examples are given, it being understood that same are intended only as illustrative and in nowise limitative.

In said examples to follow, the superconducting starting materials were of the Y-Ba-Cu-O type, whether in the form of powders or sintered shaped articles. These were prepared as follows:

1. Preparation of control specimens 1.1. Powders

A superconducting powder of the general formula $YBa_2Cu_3O_{7-x}$ ($0 \leq X \leq 0.5$) was prepared by the solid-state reaction of a mixture containing, in stoichiometric proportions and in the form of powders, yttrium oxide ($Y_2O_3$), barium carbonate ($BaCo_3$) and copper oxide (CuO), under the following conditions:

(i) 2 cycles of 10 hours at 900° C. in air, followed by grinding;

(ii) one cycle of 24 hours at 500° C. in air, followed by cooling at a rate of 100° C./hour to ambient temperature.

1.2. Sintered shaped articles

Dense superconducting shaped articles of the formula $YBa_2Cu_3O_{7-x}$ ($0 \leq X \leq 0.5$) were prepared by sintering such powders under the following conditions:

(i) pelleting the powders under a pressure of 2 tons/cm²;

(ii) one cycle of 20 hours at 900° C. in air, followed by grinding and re-pelleting;

(iii) one cycle of 20 hours at 900° C. in air, followed by cooling at a rate of 100° C./hour to ambient temperature.

EXAMPLE 1

This example illustrates the effect of temperature on the fluorination treatment according to the invention.

A control powder, such as that prepared above, was fluorinated in the apparatus shown in FIG. 1 for a cycle of 8 hours under a modest flowstream of 1 bar of undiluted fluorine, followed by a cycle of 12 hours under a static atmosphere of 1 bar of pure fluorine.

The treatment was carried out at different temperatures in order to clearly demonstrate the critical nature of this parameter in the process according to the invention.

Figure 3:
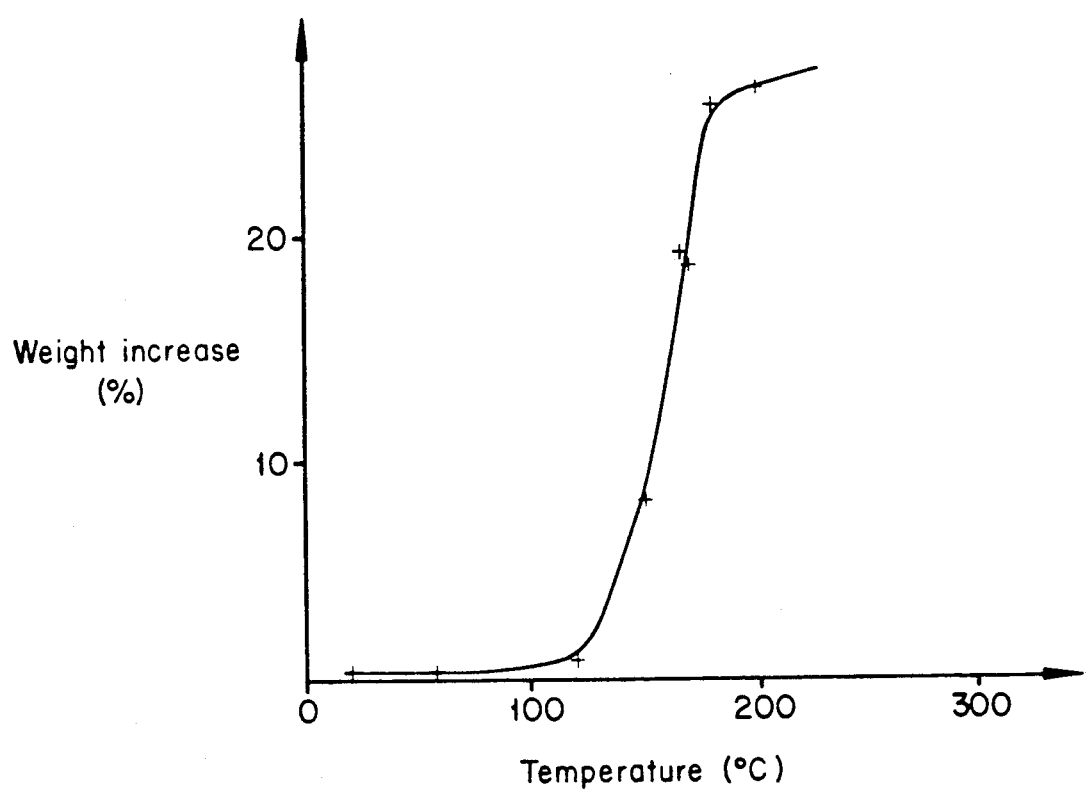
FIG. 3 is a graph plotting the weight increase of a sample of material being subjected to a fluorination treatment, as a function of temperature.

In FIG. 3 is plotted the increase in weight of the specimen as a function of the temperature of the treatment.

This curve clearly shows that the process should be limited to temperatures not exceeding 120° C. to prevent excessive weight increase, i.e., exceeding 1%, and which would result in an appreciable modification of the volumetric properties of the powder.

Accordingly, in the examples to follow the heat treatments were limited to temperatures not exceeding 120° C.

EXAMPLE 2

In this example, the surface properties of a powder treated according to the invention are illustrated.

A superconducting control powder was treated at 20° C. according to the procedure of Example 1.

The setting of the powder was 0.4%. Its X-ray diffraction pattern was identical with that of the untreated control powder.

Figure 4:
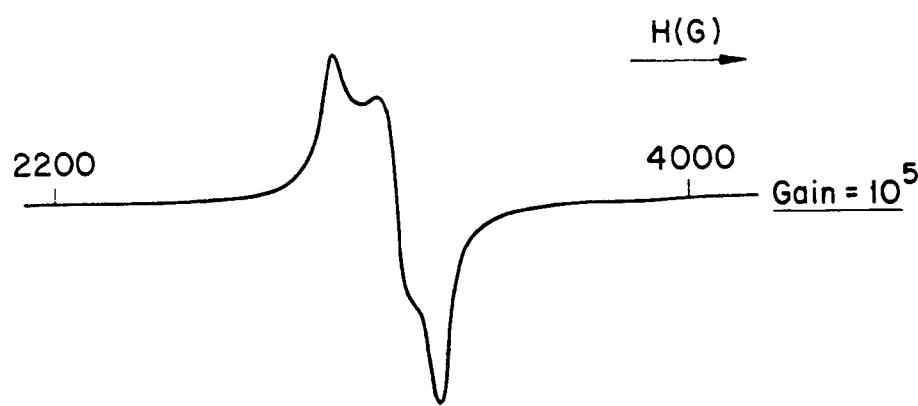
FIGS. 4 and 5 are EPR spectra, of a control powder and a fluorinated powder according to the invention, respectively.
Figure 5:

The apparent differences between the EPR (electronic paramagnetic resonance) of a control powder and a fluorinated powder, respectively represented in FIGS. 4 and 5, evidenced that the signal of the control specimen, which is due to the localized electron resonance of $Cu^{2+}$ ions (surface effect, for example), disappeared completely after fluorination.

EXAMPLE 3

As in Example 2, certain surface properties of materials treated according to the invention are also illustrated.

A sintered control specimen, that was prepared as in 1.2., was treated at 20° C. under fluorine according to the procedure of Example 1.

Figure 6:
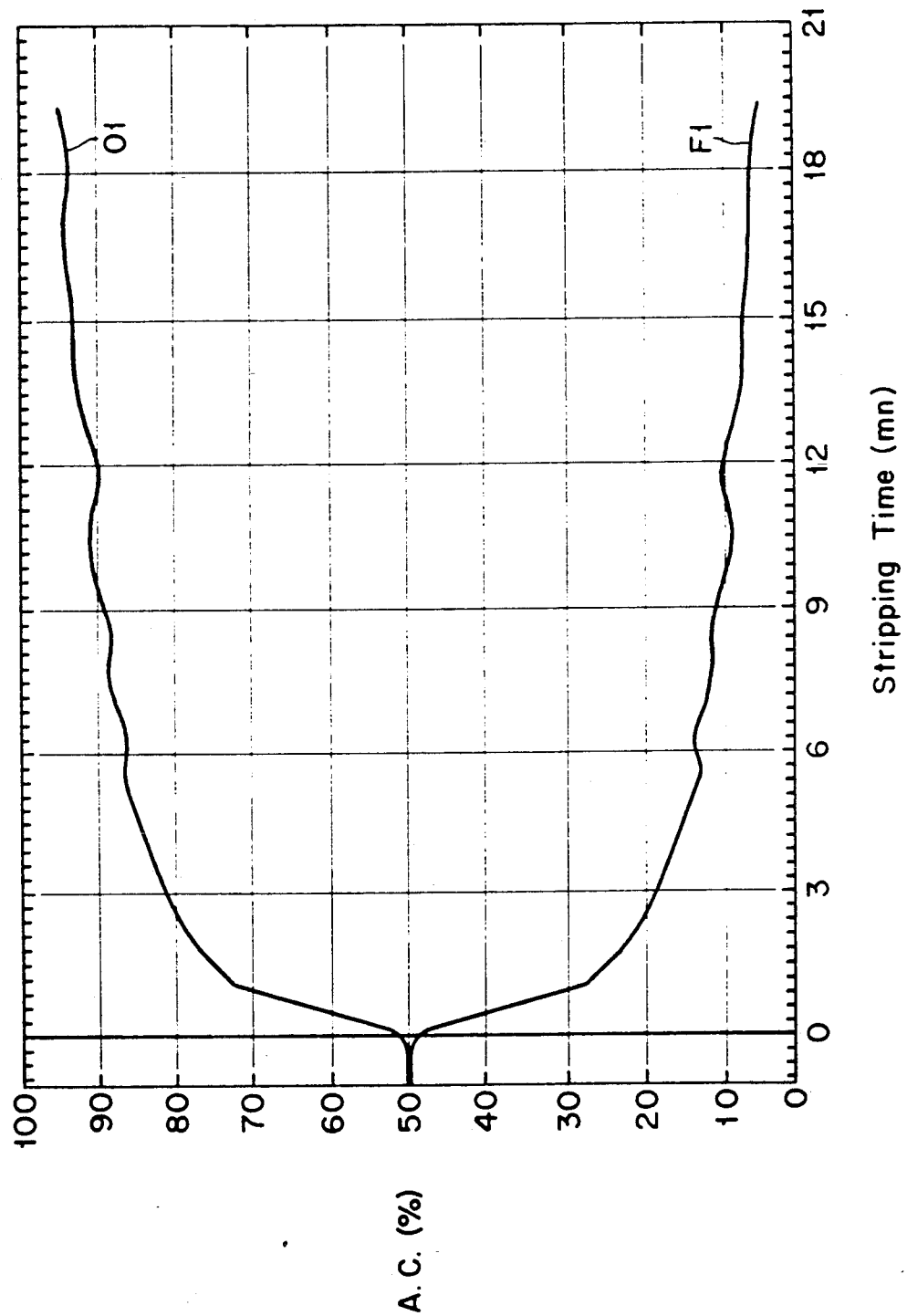
FIG. 6 is an AUGER spectrum of a fluorinated superconductor material according to the invention.

FIG. 6 shows an AUGER spectrum (AES Auger Electron Spectroscopy) of the treated product, indicating the profile of the fluorine and oxygen content in the external layers of the specimen. On the ordinate, the relative atomic concentrations of fluorine and oxygen in % are shown (F/F+O or O/F+O) and on the abcissa the time of the bombardment of the surface to be analyzed (stripping time).

The stripping rate was 50 Å/min for times between 0 and 15 min; it was 200 Å/min after 15 min.

This spectrum clearly evidenced that the fluorine atoms are preferably distributed in an external layer of material, the thickness of which was on the order of a few angstroms.

EXAMPLE 4

This example illustrates the insulation/stabilization of powders by means of the treatment according to the invention.

Two superconducting powders, one of which was a control powder, as prepared in 1.1., and one a powder according to the invention, as prepared according to Example 2, were exposed to free air (ambient temperature) for 4 months.

Figure 7:
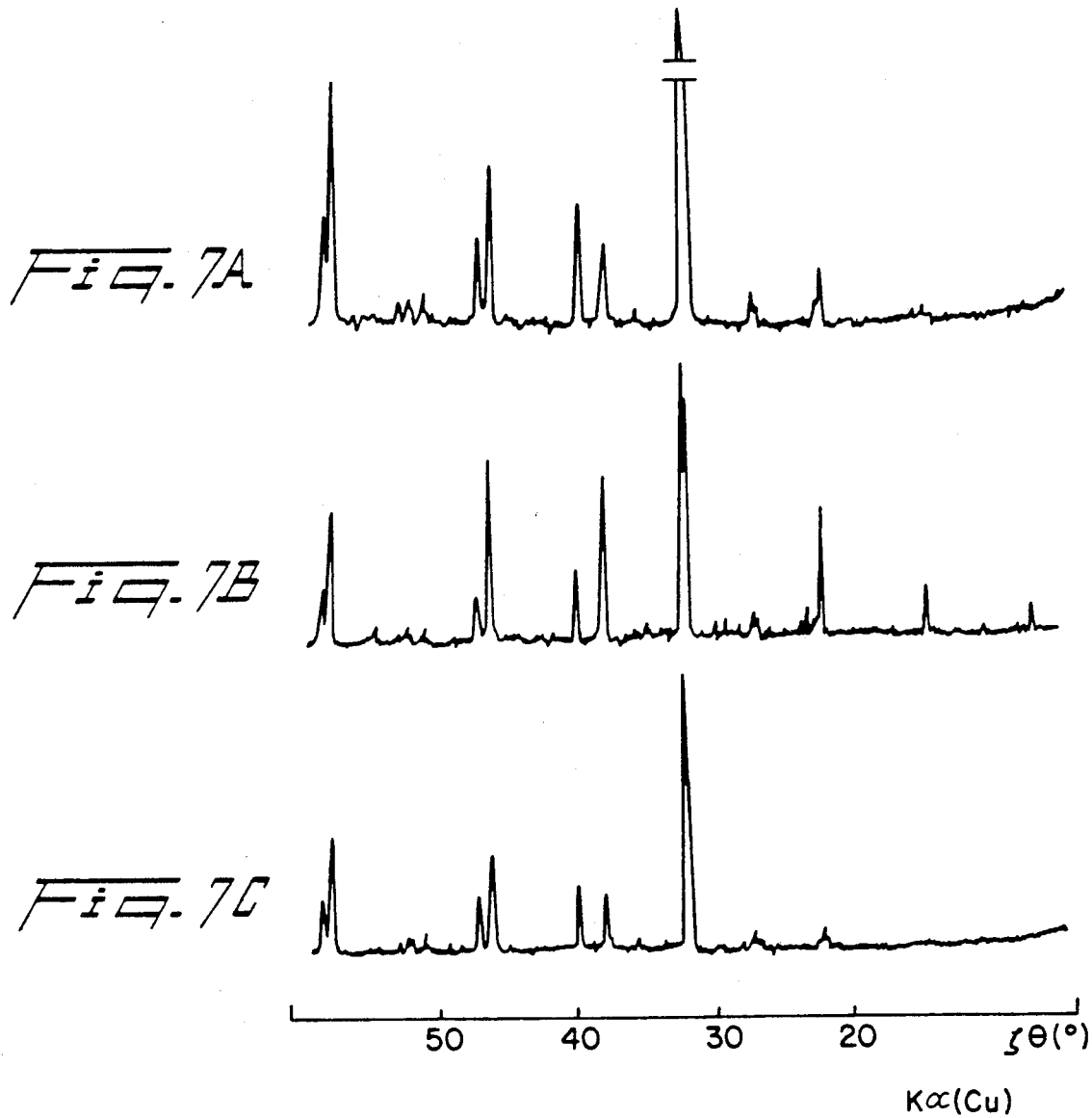
FIG. 7 includes three X-ray diffraction patterns of: (1) an untreated control powder (FIG. 7A), (2) the untreated control powder after exposure to air for 4 months (FIG. 7B), and (3) a fluorinated powder of the invention after exposure to air for 4 months (FIG. 7C)

In FIG. 7, the X-ray diffraction patterns of the powders are shown:

(a) the control powder at the beginning of the test (FIG. 7a);

(b) the control powder after 4 months in air (FIG. 7b);

(c) the powder treated according to the invention, after 4 months in air (FIG. 7c).

The pattern of FIG. 7b permits the appearance of barium carbonate at the surface of the product to be clearly identified. The barium of the Y-Ba-Cu-O phase, due to its great affinity for $CO_2$, had thus reacted with the ambient air to give $BaCO_3$, to the detriment of the superconducting phase. The pattern of FIG. 7c evidenced that the formation of $BaCO_3$ on the treated specimen was inhibited.

EXAMPLE 5

This example illustrates the insulation/stabilization of sintered shaped articles by means of the process of the invention.

Two sintered superconducting shaped articles, one of which was a control as prepared in 1.2. and one a shaped article according to the invention prepared as in Example 3, were exposed to the ambient atmosphere for 4 months (ambient temperature).

Figure 8:
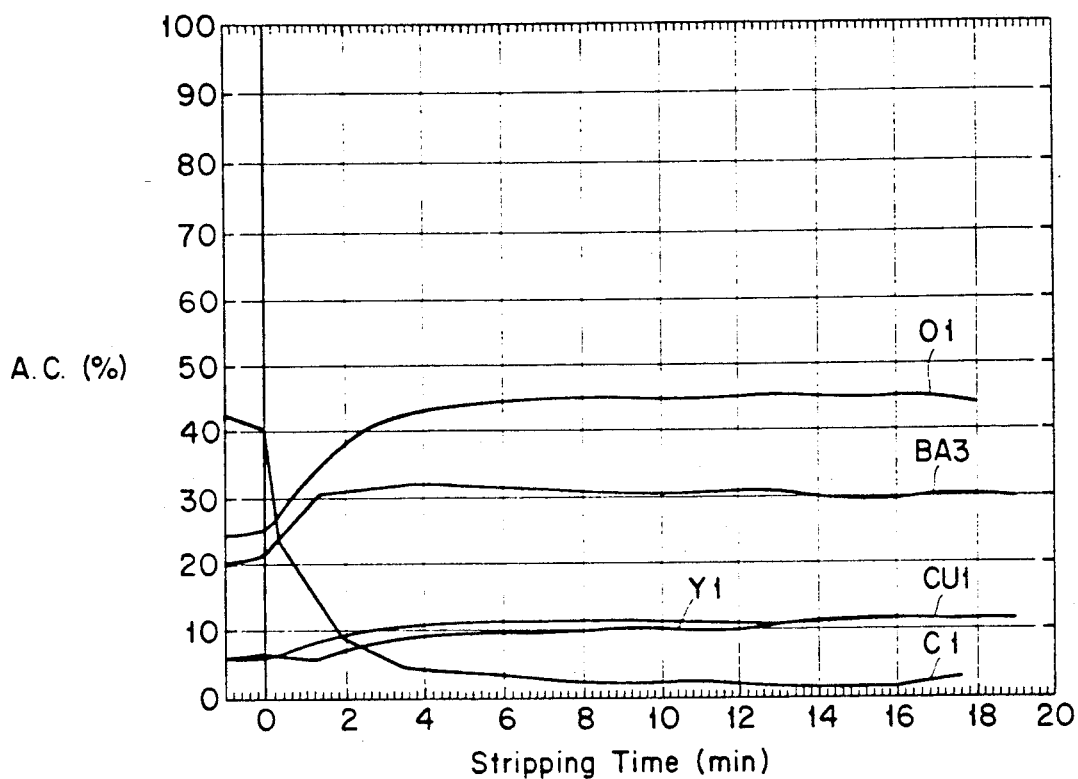
FIGS. 8 and 9 are AUGER spectra of an untreated control sample after exposure to air for 4 months (FIG. 8) and of a sample treated according to the invention (FIG. 9)
Figure 9:
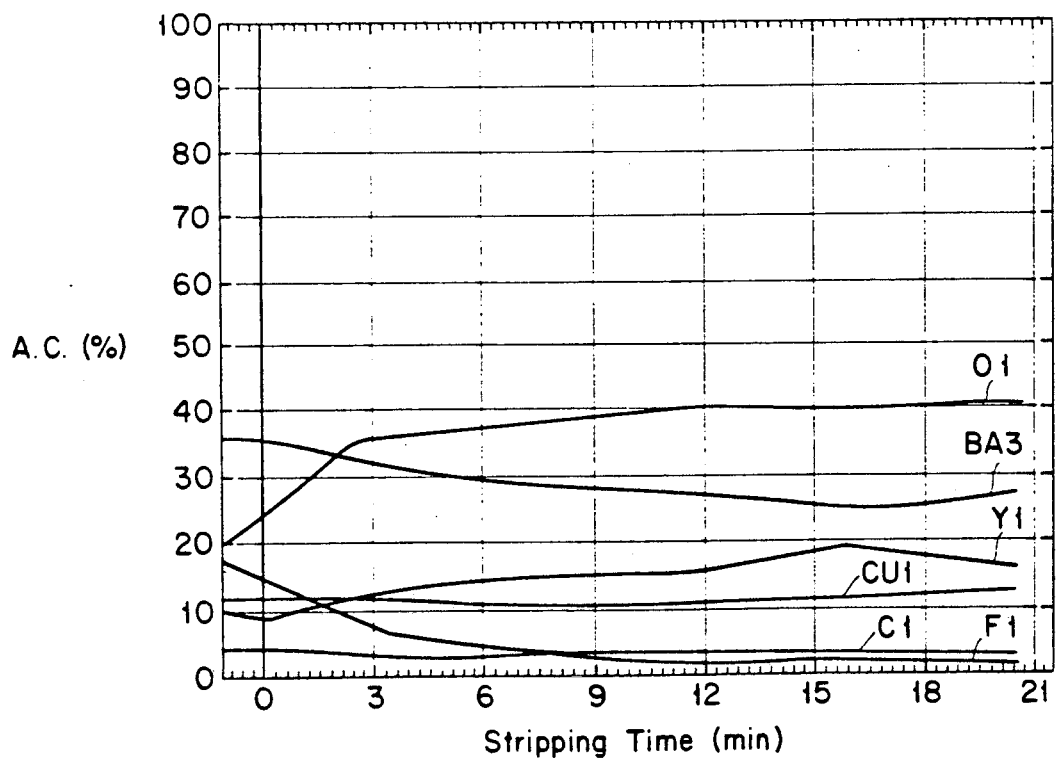

FIGS. 8 and 9 show the AUGER spectra of a part of the untreated control specimen after 4 months (FIG. 8) and of the treated shaped article (FIG. 9).

The atomic profiles of the two specimens evidenced that, in the case of the shaped article treated according to the invention, the formation of surface carbon emanating from $BaCO_3$, had been inhibited by the presence of surface fluorine values.

Remarks

In the case of FIG. 8, the rate of stripping was 50 Å/min for times between 0 and 14 min; it is 250 Å/min after 14 min.

In the case of FIG. 9, this rate was 40 Å/min for times between 0 and 6 min; it was 210 Å/min after 6 min.

EXAMPLE 6

This example also illustrates, by another method, the insulation/stabilization protective treatment according to the invention.

This method entailed a heat treatment at 500° C., under secondary vacuum and for 2 hours, of, on the one hand, a superconducting powder as prepared in 1.1. (Specimen 1), and, on the other, a powder as prepared according to Example 2 (Specimen 2).

Figure 10:
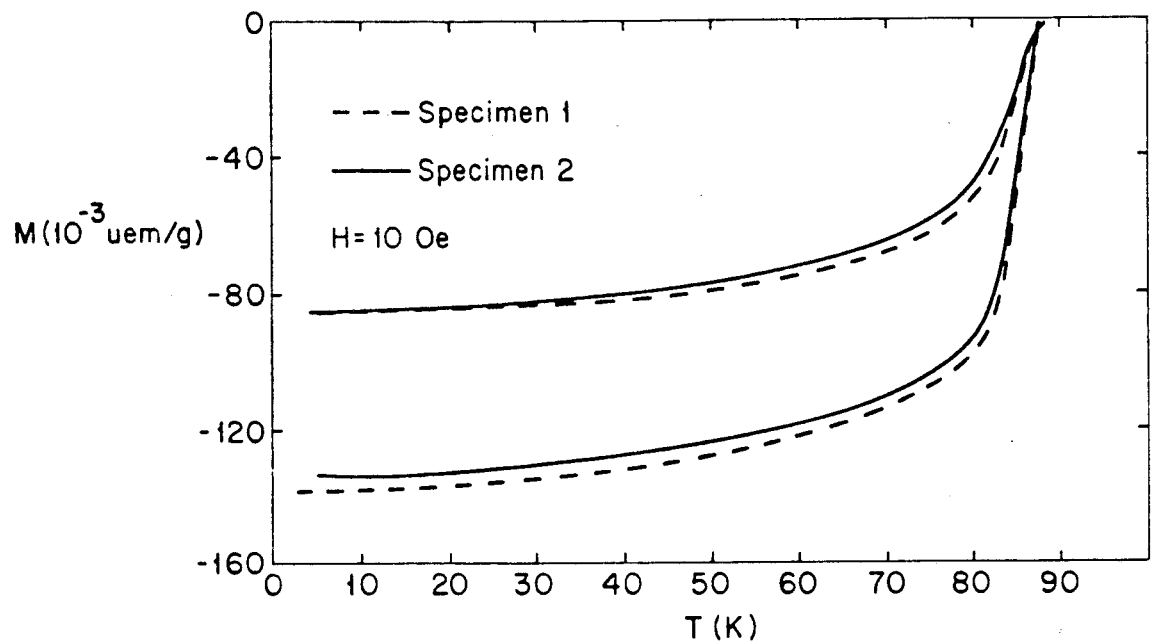
FIGS. 10 and 11 are magnetization curves showing the effects of a post-heat treatment on a control powder and a fluorinated powder according to the invention, respectively.

FIG. 10 shows magnetization curves of Specimens 1 and 2, prior to the heat treatment (the magnetization M is expressed in electromagnetic units per gram; the external field applied was 10 oerstedts). These curves show that at the outset of the test the two specimens had essentially the same diamagnetic properties.

Figure 11:
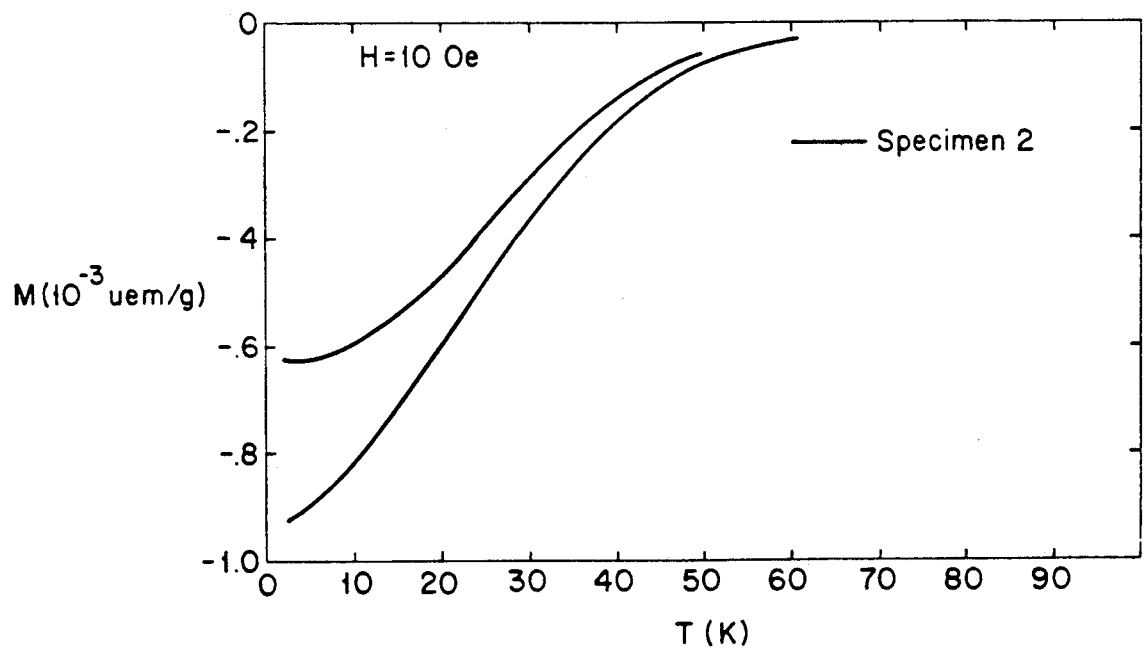

FIG. 11 shows the magnetization curves of the specimens after the aforementioned heat treatment.

It will thus be seen that the superconducting properties of Specimen 1 were destroyed by the loss of oxygen (absence of diamagnetism). In contrast, it will also be seen that for Specimen 2, treated according to the invention, the superconducting properties had not disappeared completely, due to the existence of a diffusion barrier at the surface of the specimen.

EXAMPLE 7

This example illustrates the effects of an appropriate post-heat treatment to improve the magnetic properties of materials according to the invention.

Figure 12:
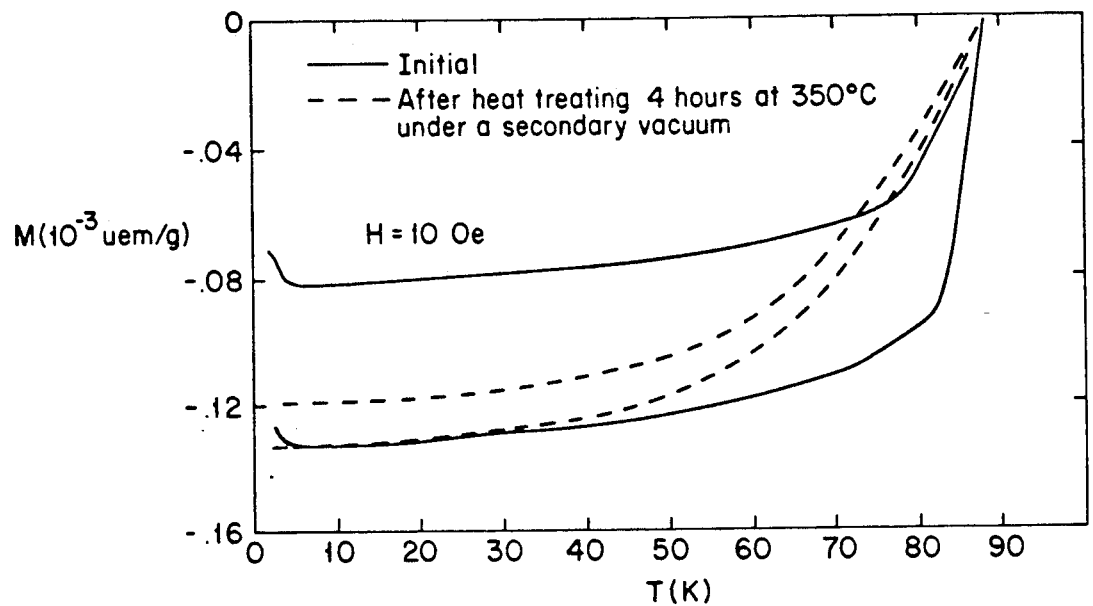
FIG. 12 includes magnetization curves showing the effects of a post-heat treatment on a fluorinated powder according to the invention, using a temperature of 60° C., and on the same fluorinated powder, using a temperature of 350° C.

FIG. 12 shows the magnetization curves, on the one hand of a powder according to the invention as prepared in Example 1 using a temperature of 60° C. (beginning specimen), and, on the other, of the same powder subsequently treated under secondary vacuum at 350° C. for 4 hours.

These curves show clearly that the heat treatment described above enabled modification of the magnetic properties of the initial specimen and, more particularly, the magnetic field expulsion curve, the so-called Meissner effect. More precisely, this curve shows an increase in the Meissner effect on the post-treated specimen.

Such a property is of interest for use in magnetic shielding devices in weak magnetic fields.

A treatment of this type on an untreated specimen had the result of reducing the Meissner effect.

EXAMPLE 8

This example illustrates the improvement in the electrical properties of sintered superconductor materials treated according to the invention.

Figure 13:
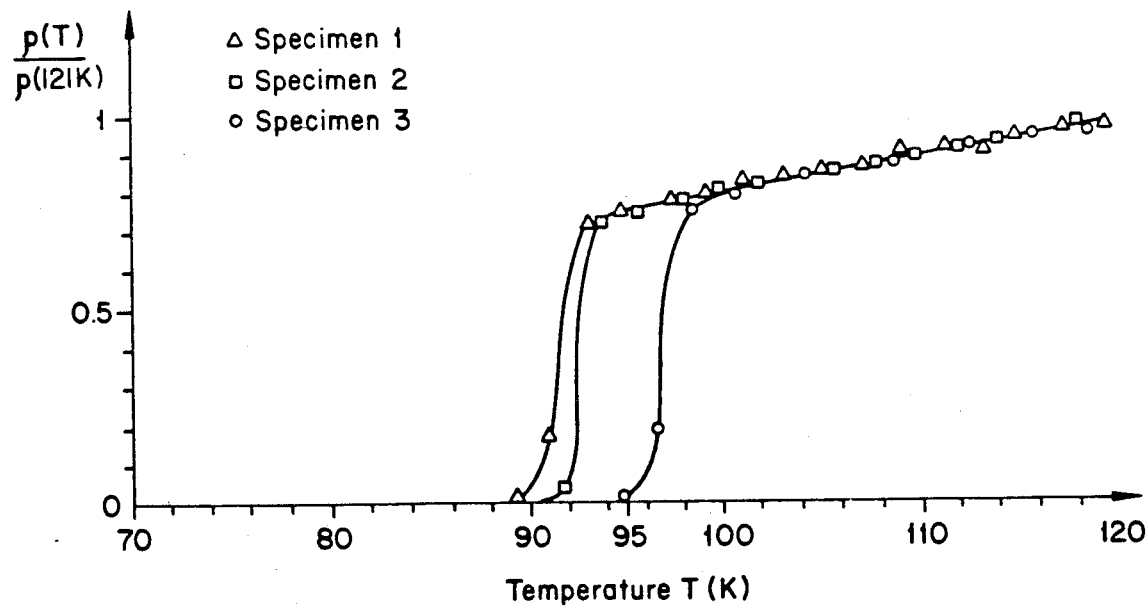
FIG. 13 includes resistivity curves, as a function of temperature, of an untreated sample, of a sample treated at 20° C. according to the invention, and of a sample treated at 100° C. according to the invention.

FIG. 13 shows the resistivity curves, as a function of temperature, of three sintered specimens:

(1) a Specimen 1, as prepared in 1.2.;

(2) a Specimen 2 resulting from the treatment of Specimen 1 at 20° C. under fluorine, according to the procedure of Example 1;

(3) a Specimen 3 resulting from the treatment of Specimen 1 at 100° C. under fluorine, also according to according to the procedure of Example 1.

These curves clearly show an improvement in the critical temperature, Tc, of the specimens treated according to the invention, the improvement amounting to 5° C. for the specimen treated at 100° C.

EXAMPLE 9

This example illustrates the formation of an insulating layer of fluorine compounds at the surface of a crystal treated according to the invention, namely, a layer of organic fluoride.

The surface of the insulating/stabilizing layer formed by fluorination was observed by XPS (X-ray photoelectron spectroscopy). This method required the use of a crystal that was prepared, in particular, by the method described by D. L. Kaiser, S. Holtzberg, B. A. Scott and T. R. McGuire (*Applied Physics Letters*, 51, 1040 (1987)).

Figure 14:
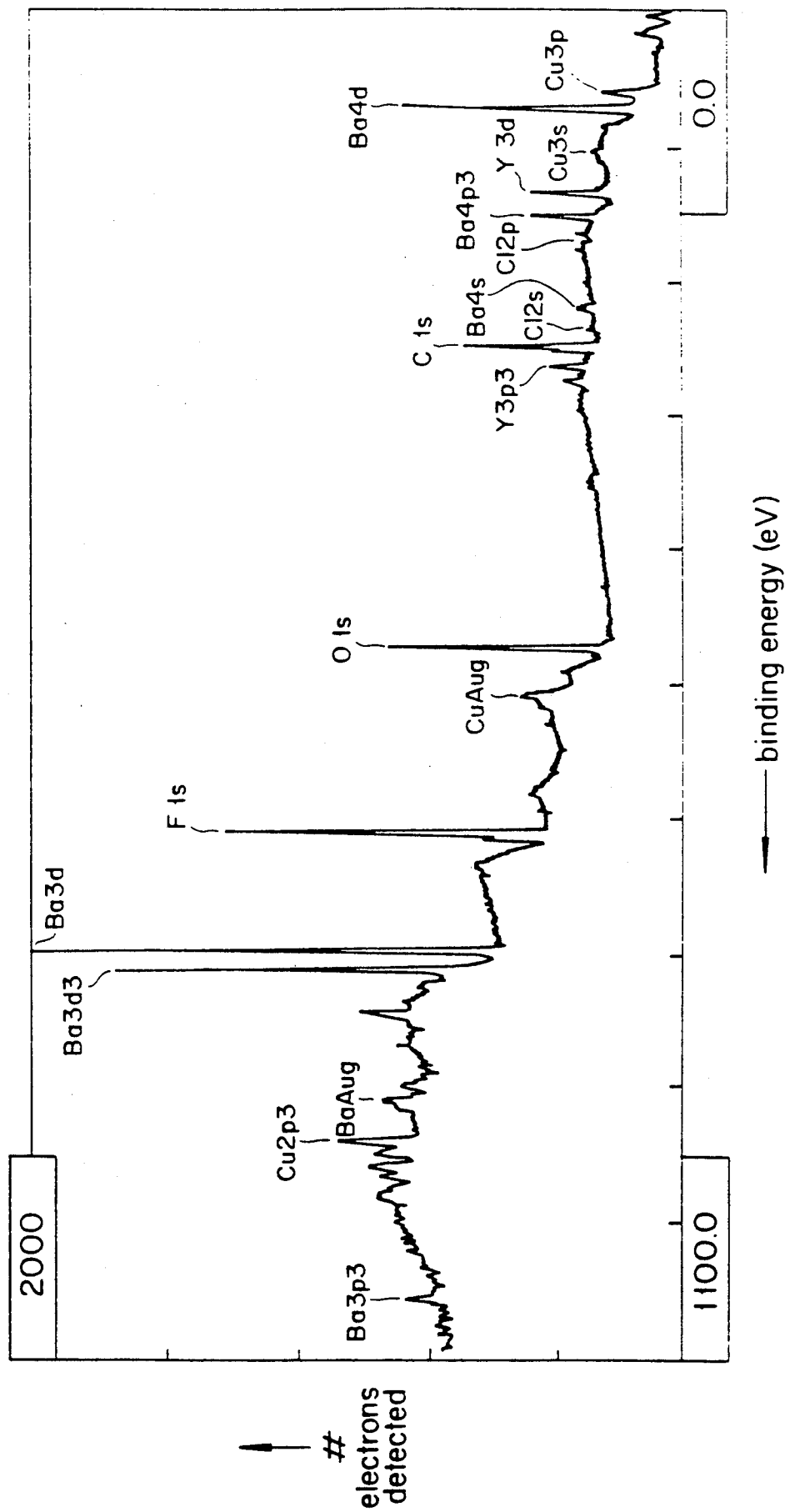
FIG. 14 is an XPS spectrum of a superconductor crystal treated according to the invention.

FIG. 14 shows the complete XPS spectrum of a $YBa_2Cu_3O_{7-x}$ ($0 \leq X \leq 0.5$) crystal treated with fluorine at 100° C. as in Example 1, and FIG. 15 the peak envelope (Fls) of fluorine. This figure clearly shows the presence of a peak at a transition energy $Et \approx 689$ eV, which is characteristic of a C—F bond identical with that existing in fluorocarbons and in graphite fluorides.

The organic fluoride content may be increased by adding graphite during the fluorination treatment and- /or if the surface of the material is strongly carbonated prior to the treatment. This layer may be eliminated by heating the specimen.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including equivalents thereof.

What is claimed is:

1. A process for the preparation of a superconductor material having an effective stabilizing amount of fluorine atoms distributed therein in a concentration gradient decreasing from the external face surface of such material to the core region thereof, said process comprising fluorinating a ceramic superconducting material at a temperature no greater than 120° C.

2. The process as defined by claim 1, said fluorination being at a temperature of about 20° C.

3. The process as defined by claim 1, wherein the agent of fluorination comprises a fluorinating gas.

4. The process as defined by claim 1, carried out under atmosheric pressure.

5. The process as defined by claim 1, further comprising post-heat treating the fluorinated superconductor material.

6. The process as defined by claim 3, said fluorinating gas comprising fluorine, hydrofluoric acid, tetrafluoromethane, a halogen fluoride, a rare gas fluoride, nitrogen fluoride or boron fluoride.

7. The process as defined by claim 5, said post-heat treatment being carried out under a vacuum and at a temperature no greater than 500° C.

8. The process as defined by claim 6, said fluorinating gas comprising fluorine.

9. A process for the preparation of a superconductor material having an effective stabilizing amount of fluorine atoms distributed therein in a concentration gradient decreasing from the external face surface of such material to the core region thereof, said process comprising fluorinating a ceramic superconducting material at a temperature no greater than 120° C. such that the core region of said superconducting material is not appreciably modified.

* * * * *